United States Patent
Inoue et al.

(10) Patent No.: US 10,446,518 B2
(45) Date of Patent: Oct. 15, 2019

(54) SINTERABLE BONDING MATERIAL AND SEMICONDUCTOR DEVICE USING THE SAME

(71) Applicants: HENKEL AG & CO. KGAA, Duesseldorf (DE); HENKEL IP & HOLDING GMBH, Duesseldorf (DE)

(72) Inventors: Hajime Inoue, Yokohama (JP); Tadashi Takano, Yokohama (JP)

(73) Assignees: HENKEL AG & CO. KGAA, Duesseldorf (DE); HENKEL IP & HOLDING GMBH, Duesseldorf (DE)

(\*) Notice: Subject to any disclaimer, the term of this patent is extended or adjusted under 35 U.S.C. 154(b) by 0 days.

(21) Appl. No.: 15/631,282

(22) Filed: Jun. 23, 2017

(65) Prior Publication Data

US 2017/0294404 A1 Oct. 12, 2017

Related U.S. Application Data

(63) Continuation of application No. PCT/JP2014/084765, filed on Dec. 26, 2014.

(51) Int. Cl.
*H01L 23/00* (2006.01)
*B23K 35/02* (2006.01)
(Continued)

(52) U.S. Cl.
CPC ............ *H01L 24/83* (2013.01); *B22F 1/0055* (2013.01); *B22F 1/0059* (2013.01);
(Continued)

(58) Field of Classification Search
CPC ... B23K 35/0244; B23K 35/025; H01L 24/29; H01L 24/83
See application file for complete search history.

(56) References Cited

U.S. PATENT DOCUMENTS

| 5,232,962 A | 8/1993 | Dershem et al. |
| 2010/0270515 A1* | 10/2010 | Yasuda ............... B22F 1/0074 252/514 |

(Continued)

FOREIGN PATENT DOCUMENTS

| JP | 60-120778 A | 6/1985 |
| JP | 7-126489 A | 5/1995 |

(Continued)

OTHER PUBLICATIONS

Li et al., An Introduction to Electrically Conductive Adhesives, Int. J. Microelectronic Packaging, 1(3), pp. 159-175 (1998).*

(Continued)

*Primary Examiner* — Syed I Gheyas
(74) *Attorney, Agent, or Firm* — Steven C. Bauman

(57) ABSTRACT

An objective of the present invention is to provide a sinterable bonding material capable of providing a bonded article having a long-term reliability. The present invention relates to a sinterable bonding material comprising a silver filler and resin particles, wherein the silver filler comprises a flake-shaped filler having an arithmetic average roughness (Ra) of 10 nm or less; and the resin particles have an elastic modulus (E) of 10 GPa or less, and a heat decomposition temperature of 200° C. or more. The sintered product of the sinterable bonding material of the present invention is excellent in bonding strength and heat-release characteristics, and has an improved stress relaxation ability.

12 Claims, 4 Drawing Sheets

(51) Int. Cl.
*B22F 1/00* (2006.01)
*B22F 3/22* (2006.01)
*B22F 7/04* (2006.01)
*B22F 7/08* (2006.01)
*H05K 3/32* (2006.01)
*B22F 7/06* (2006.01)

(52) U.S. Cl.
CPC .............. *B22F 1/0074* (2013.01); *B22F 3/22* (2013.01); *B22F 7/04* (2013.01); *B22F 7/08* (2013.01); *B23K 35/0244* (2013.01); *H01L 24/29* (2013.01); *B22F 7/064* (2013.01); *B22F 2007/047* (2013.01); *H01L 2224/04026* (2013.01); *H01L 2224/05639* (2013.01); *H01L 2224/05644* (2013.01); *H01L 2224/05647* (2013.01); *H01L 2224/05655* (2013.01); *H01L 2224/2939* (2013.01); *H01L 2224/2949* (2013.01); *H01L 2224/2969* (2013.01); *H01L 2224/29139* (2013.01); *H01L 2224/29339* (2013.01); *H01L 2224/29499* (2013.01); *H01L 2224/32225* (2013.01); *H01L 2224/32245* (2013.01); *H01L 2224/8384* (2013.01); *H01L 2224/83222* (2013.01); *H01L 2224/83411* (2013.01); *H01L 2224/83439* (2013.01); *H01L 2224/83444* (2013.01); *H01L 2224/83455* (2013.01); *H05K 3/32* (2013.01); *H05K 2203/1131* (2013.01)

(56) References Cited

U.S. PATENT DOCUMENTS

| | | | |
|---|---|---|---|
| 2011/0186340 | A1 | 8/2011 | Kuramoto et al. |
| 2015/0262728 | A1* | 9/2015 | Ogiwara ................. H01B 1/22 427/98.4 |

FOREIGN PATENT DOCUMENTS

| | | | |
|---|---|---|---|
| JP | 11-026480 | A | 1/1999 |
| JP | 11-044705 | A | 2/1999 |
| JP | 2001-170957 | A | 6/2001 |
| JP | 2002-367427 | A | 12/2002 |
| JP | 2006-183072 | A | 12/2004 |
| JP | 2005-220486 | A | 8/2005 |
| JP | 2006-352080 | A | 12/2006 |
| JP | 4247801 | B2 | 4/2009 |
| JP | 2009289745 | A | 12/2009 |
| JP | 2010018832 | A | 1/2010 |
| JP | 2010-125751 | A | 6/2010 |
| JP | 2010-171271 | A | 8/2010 |
| JP | 2010180327 | A * | 8/2010 |
| JP | 2012-052198 | A | 9/2010 |
| JP | 2011-040915 | A | 2/2011 |
| JP | 2011-095244 | A | 5/2011 |
| JP | 2011-153362 | A | 8/2011 |
| JP | 2011-198674 | A | 10/2011 |
| JP | 2011-240406 | A | 12/2011 |
| JP | 2012-085582 | A | 5/2012 |
| JP | 2012-519443 | A | 8/2012 |
| JP | 2013-41884 | A | 2/2013 |
| JP | 2013216919 | A | 10/2013 |
| JP | 2014-029897 | A | 2/2014 |
| JP | 2014-074132 | A | 4/2014 |
| JP | 2014-196527 | A | 10/2014 |

OTHER PUBLICATIONS

Agar, Highly Conductive Stretchable Electrically Conductive Composites for Electronic and Radio Frequency Devices.*

* cited by examiner

Figure 2

| Example (Porosity (%)) | initial | 250 cycle | 500 cycle | 750 cycle |
|---|---|---|---|---|
| Example 1 | 6.5% | 7.0% | 11.0% | 13.5% |
| Comparative Example 1 | 1.0% | 1.5% | 3.0% | 8.5% |
| Comparative Example 2 | 13.0% | 15.0% | 23.0% | 19.5% |

| | initial | 250 cycle | 500 cycle | 750 cycle |
|---|---|---|---|---|
| Example 1 |  |  |  |  |
| Comparative Example 1 |  |  |  |  |
| Comparative Example 2 |  |  |  |  |

SINTERABLE BONDING MATERIAL AND SEMICONDUCTOR DEVICE USING THE SAME

FIELD OF THE INVENTION

The present invention relates to a bonding material, and in particular, a sinterable bonding material having excellent stress relaxation ability, and a manufacturing method of the same. The present invention further relates to a semiconductor device manufactured by using the bonding material, and a manufacturing method of the same.

BACKGROUND OF THE INVENTION

Due to size and weight reduction of electronic devices and their improved performance, the amount of heat that generates in a semiconductor device tends to increase. In recent years in a motor controlling field, a power semiconductor having a large band gap such as silicon carbide or gallium nitride has been developed for applications in which high voltage or high current is required such as an electric power device, a vehicle, or a machine tool. Such a power semiconductor can operate at a higher temperature compared with a conventional silicon semiconductor because the semiconductor element itself has high heat resistance.

In order to take advantage of such characteristics of the power semiconductor, a bonding material having an excellent thermal conductivity is required, which can efficiently release the heat generated in operation of the semiconductor. As described in Patent Literature 1, in recent years, a paste containing nano-sized metal fine particles has been studied as a bonding material having an excellent thermal conductivity. In a bonding method using such a paste, a sintering phenomenon of metal particles is utilized for the bonding.

However, in the bonding method utilizing the sintering phenomenon of metal particles as described in Patent Literature 1, a shrinkage stress is generated by a sintering shrinkage caused by a sintering reaction, and remains in a bonded part. Furthermore, when members to be bonded have largely different thermal expansion coefficients, a higher thermal stress is applied to the bonded part during a cooling-heating cycle at the operation of the semiconductor device, which leads to problems such as generation of cracks in semiconductor elements or in the bonded part, or exfoliation of the bonded part.

As a method for reducing such a thermal stress applied to a bonded part, Patent Literature 2 discloses a conductive bonding material comprising metal fine particles made of a first metal, and metal-coated resin particles having a diameter larger than that of the metal fine particles and coated with a second metal. Patent Literature 2 explains that, with such a bonding material, the stress applied to a bonded part between a semiconductor element and a circuit pattern can be reduced.

Patent Literature 3 discloses a semiconductor device including a metal lead frame and a semiconductor chip in which the semiconductor chip and the metal lead frame are bonded by a porous joint layer in which conductive particles containing Ag as a bonding material are bonded to each other, and at least a part of air spaces among the conductive particles is filled with a thermosetting resin.

On the other hand in Patent Literature 4, there is disclosed a semiconductor device including a semiconductor chip and an insulating substrate in which the insulating substrate comprises the semiconductor chip mounted thereon and an electrode plate provided on its surface. Patent Literature 4 discloses that, in a sintering metal layer that bonds the semiconductor chip and the electrode plate, a porosity of an end part of the layer is set to be higher than a porosity of the center part of the layer, and thereby a stress applied to the end part of the bonding layer can be relaxed.

PATENT LITERATURE

Patent Literature 1: Japanese Patent Laid-Open No. 2006-352080
Patent Literature 2: Japanese Patent Laid-Open No. 2011-198674
Patent Literature 3: Japanese Patent Laid-Open No. 2010-171271
Patent Literature 4: Japanese Patent Laid-Open No. 2014-29897

In the conductive bonding material described in Patent Literature 2, divinylbenzene cross-linked polymer is used as the resin for the metal-coated resin particles. Therefore, when the bonding material is used for a semiconductor device that operates at a high temperature such as a power semiconductor, the heat resistance of the resin is not sufficient, and the deterioration of the mechanical characteristics of the resin may occur during sintering process or high temperature operation, which may disadvantageously impair long-term reliability of the semiconductor device.

The method for manufacturing the semiconductor device described in Patent Literature 3 requires the step of filling the bonding layer with a liquid curable resin in a stage after forming the bonding layer, and curing the liquid curable resin, which makes the manufacturing process troublesome. Furthermore, the bonding layer is filled with the resin from outside of the bonding layer, which disadvantageously causes a non-uniform filling of the resin to provide insufficient stress relaxation ability.

When the porosity is increased in order to relax the stress applied to the bonded part of the semiconductor device as described in Patent Literature 4, the state of air spaces in the bonding layer changes during operation, particularly during long-term operation at a high temperature such as 200° C. or more, which decreases bonding strength or causes exfoliation of the bonded part or the like, to disadvantageously impair long-term reliability of the semiconductor device.

SUMMARY OF THE INVENTION

The present invention has been accomplished in view of the above problems, and an object of the present invention is to provide a bonding material capable of providing a bonded article having excellent bonding strength and heat release characteristics, capable of reducing a stress applied to a bonded part, and having excellent long-term reliability.

One aspect of the present invention relates to a sinterable bonding material comprising a silver filler and resin particles, wherein the silver filler comprises a flake-shaped filler having an arithmetic average roughness (Ra) of 10 nm or less; and the resin particles have an elastic modulus (E) of 10 GPa or less, and a heat decomposition temperature of 200° C. or more.

The present invention can provide a bonding material capable of providing a bonded article having excellent long-term reliability.

BRIEF DESCRIPTION OF THE FIGURES

FIG. 2 are SEM images of the cross-sectional surface of the bonding layer before and after the cooling-heating cycle in Examples.

DETAILED DESCRIPTION OF THE INVENTION

Figure 1:
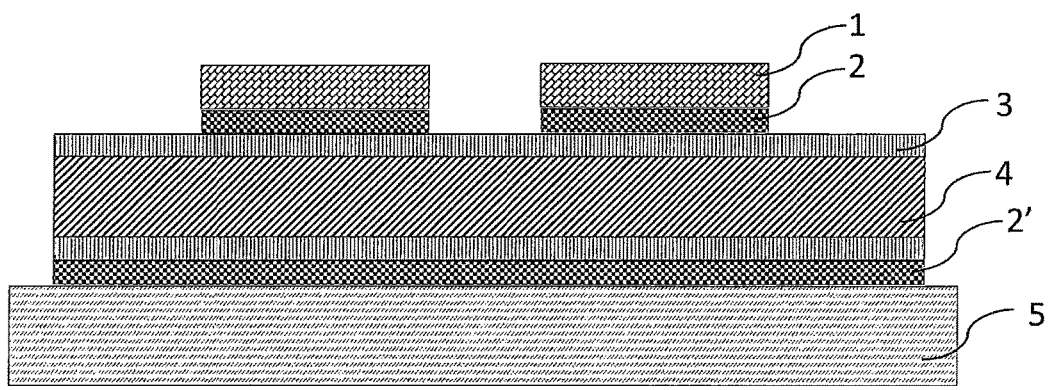
FIG. 1 is a partial cross-sectional view of a semiconductor device according to one embodiment of the present invention.

One aspect of the present invention relates to that, by adding resin particles having an elasticity in a specific range to a bonding material mainly consisting of a silver filler, a stress applied to a bonded part can be effectively reduced while maintaining excellent bonding strength and thermal conductivity, and as a result, a bonded article having excellent long-term reliability is obtained. Such a bonding material is particularly suitable for a semiconductor device that can operate at high temperature such as a power semiconductor.

A bonding material according to the present invention comprises a silver filler and heat-resistant resin particles having a specific elastic modulus. Hereinafter, components of the bonding material according to the present invention will be described in details.

Silver Filler

The silver filler is a main component of the bonding material according to the present invention. The silver fillers in the bonding material fuse together (sinter) by heating to form a silver sintered product, and thereby a bonding layer having excellent thermal conductivity and bonding strength is formed.

The content of the silver filler of the bonding material according to the present invention is preferably 90% by mass or more of the total mass of solid components in the bonding material, more preferably 91% by mass or more, and still more preferably 93% by mass or more, and in one embodiment, 94% by mass or more may be particularly preferable. A bonding material having superior bonding strength and thermal conductivity is obtained as the content of the silver filler is increased. The content of the silver filler is 99.9% by mass or less, and preferably 99.0% by mass or less of the solid component in the bonding material. The "solid component" herein refers to all the components in the bonding material excluding components which vanish from the bonding layer by heating.

The silver filler preferably has a central particle diameter of 1 nm to 50 µm. The central particle diameter of the silver filler is more preferably 10 nm to 30 µm, and still more preferably 100 nm to 20 µm. When the particle diameter of the silver filler is within the above range, the sinterability of the filler can be more improved. In addition, the fillers are well dispersed in the bonding material, which can improve the preservation stability of the bonding material, and provide an uniform bonding strength. Herein, the "central particle diameter" of the silver filler represents a median diameter (50% particle diameter: D50) in a volume-basis particle size distribution curve obtained by measurement with a laser diffraction particle size analyzer.

The shape of the silver filler is not particularly limited, and examples of which include a spherical-shaped, approximately spherical-shaped, elliptical spherical-shaped, spindle-shaped, cube-shaped, approximately cube-shaped, flake-shaped, and unshaped-shaped. Among them, from the viewpoint of preservation stability, the spherical-shaped, approximately spherical-shaped, and flake-shaped fillers are preferably used.

In one embodiment, the flake-shaped filler is still more preferable. Examples of the flake-shaped filler may include plate-shaped, lamellar-shaped, and scale-shaped fillers. Preferable examples of the flake-shaped filler include a particle having a thin plate shape in a side direction, and a circular shape, an elliptical shape, a polygonal shape, or an unshaped shape in a front face direction. The filler having such a shape has excellent heating sinterability because of a high contact area between the fillers, which can reduce porosity in a sintered product.

The content of the flake-shaped filler is preferably 30% by mass or more of the silver filler, more preferably 50% by mass or more, and still more preferably 60% by mass or more, and further more preferably 70% by mass or more of the silver filler. In one embodiment, the content of the flake-shaped filler is preferably 80% by mass or more, more preferably 90% by mass or more, and may be 100% by mass. When the flake-shaped filler is contained in the above range, a sintered product having a low porosity and excellent thermal conductivity can be formed.

A preferable example of the flake-shaped filler will be described below.

In the present invention, a flake-shaped filler having a smooth surface is particularly preferable. Since such a filler has a flat surface, the contact area between the fillers is more increased, which realize an excellent sinterability and thereby provides a bonding layer having an excellent thermal conductivity. In addition, since the filler has a smooth surface, the filler has excellent dispersibility, and thereby a bonding layer having homogeneous bonding strength and stress relaxation ability can be formed.

Herein, when the filler has a smooth surface, an arithmetic average roughness (Ra) of the surfaces is preferably 20 nm or less, and more preferably 10 nm or less. From the viewpoints of dispersibility of the filler and thermal conductivity of the bonding layer obtained therefrom, the arithmetic average roughness (Ra) is preferably 8.5 nm or less, more preferably 5 nm or less, and still more preferably 3.5 nm or less. Considering the ease of manufacturing, the arithmetic average roughness (Ra) is preferably 1 nm or more.

Herein, the arithmetic average roughness (Ra) can be measured with an atomic force microscope (AFM). The AFM traces a sample surface using a probe attached to a tip of a cantilever, or scans the sample surface maintaining a constant distance between the probe and the sample surface. The concavo-convex shape of the sample surface is evaluated by measuring vertical displacement of the cantilever. The measurement conditions are as follows.

Mode: Contact Mode
Cantilever: OMCL-TR800PSA-1 manufactured by Olympus Corporation
Height-Directional Resolution: 0.01 nm
Lateral-Directional Resolution: 0.2 nm Furthermore, the flake-shaped filler having the smooth surface is preferably a crystalline filler. The crystalline flake-shaped filler has excellent sinterability, which can provide excellent bonding strength. The crystal may be a single crystal or a polycrystal. From the viewpoint of the smoothness of the surface, the crystal is more preferably a single crystal. The crystalline silver filler can be confirmed by X-ray diffraction analysis or the like.

The flake-shaped filler of the present embodiment preferably has a central particle diameter (D50) of 0.05 µm or more and 20 µm or less. Particles having a central particle diameter of 0.05 µm or more are easily manufactured, and particles having a central particle diameter of 20 µm or less have excellent sinterability. The central particle diameter is more preferably 15 µm or less, and still more preferably 8 µm or less, and in one embodiment, 5 µm or less may be particularly preferable. The central particle diameter is more preferably 0.1 µm or more, and still more preferably 0.3 µm or more.

The standard deviation (ED) of the particle diameter is preferably 10 µm or less, more preferably 8 µm or less, and still more preferably 4 µm or less. Herein, the standard deviation (δD) of the particle diameter is a value calculated based on particle diameters of 100 particles selected at random.

The average thickness (T) of the particles is preferably 1 nm or more and 100 nm or less. Particles having an average thickness of 1 nm or more can be more easily manufactured, and particles having an average thickness of 100 nm or less can provide a sintered product having excellent thermal conductivity. The average thickness is more preferably 80 nm or less, and still more preferably 50 nm or less. The average thickness is more preferably 10 nm or more, and still more preferably 20 nm or more. Herein, the average thickness (T) of the particles is an average value of thicknesses of 100 particles selected at random. The thicknesses of the particles can be measured based on a scanning electron microscope (SEM) photograph, visually or by using an image-analysis software.

The aspect ratio (central particle diameter (D50)/average thickness (T) of particles) of the flake-shaped filler is preferably 20 or more and 1000 or less. The aspect ratio is more preferably 30 or more, and still more preferably 35 or more. The aspect ratio is more preferably 500 or less, still more preferably 200 or less, and particularly preferably 100 or less.

The silver filler that can be used for the present invention can be manufactured by a known method such as a reduction method, a milling method, an electrolysis method, an atomization method, or a heat treatment method. Examples of a method for manufacturing a flake-shaped filler such as those described above include a method described in Japanese Patent Laid-Open No. 2014-196527. The entire disclosure thereof is incorporated herein by reference.

In one embodiment, the surface of the silver filler may be coated with an organic substance.

The amount of the organic substance is preferably 0.01 to 10% by weight of the silver filler, and more preferably 0.1 to 2% by weight. It is also preferable to adjust the amount of the organic substance according to the shape of the silver filler or the like. The amount of the organic substance can be measured by volatilizing or thermally decomposing the organic substance by heating, and measuring a weight decrease, for example.

Herein, the state where a silver filler is "coated with the organic substance" includes a state where an organic solvent is adhered to the surface of a silver filler by dispersing the silver filler in the organic solvent.

Examples of the organic substance coating the silver filler may include a hydrophilic organic compound such as an alkyl alcohol having 1 to 5 carbon atoms, an alkanethiol having 1 to 5 carbon atoms, and an alkane polyol having 1 to 5 carbon atoms, or a lower fatty acid having 1 to 5 carbon atoms; and a hydrophobic organic compound such as a higher fatty acid having 15 or more carbon atoms and its derivatives, a middle fatty acid having 6-14 carbon atoms and its derivatives, an alkyl alcohol having 6 or more carbon atoms, an alkylamine having 16 or more carbon atoms, or an alkanethiol having 6 or more carbon atoms.

Among them, the higher fatty acid, the middle fatty acid, and their metal salts, amide, amine, or ester compounds are preferable. A water-repellent (hydrophobic) organic compound is more preferably a higher or middle fatty acid, or its water-repellent derivatives. In view of its coating effect, the higher or middle fatty acid is particularly preferable.

Examples of the higher fatty acid include a straight-chain saturated fatty acid such as pentadecanoic acid, hexadecane acid, heptadecanoic acid, octadecanoic acid, 12-hydroxy octadecanoic acid, eicosanoic acid, docosanoic acid, tetracosanoic acid, hexacosanoic acid (cerinic acid), or octacosanoic acid; a branched saturated fatty acid such as 2-pentyl nonanoic acid, 2-hexyl decanoic acid, 2-heptyl dodecanoic acid, or isostearic acid; and an unsaturated fatty acid such as palmitoleic acid, oleic acid, isooleic acid, elaidic acid, linoleic acid, linolenic acid, recinoleic acid, gadoleic acid, erucic acid, and selacholeic acid.

Examples of the middle fatty acid include a straight-chain saturated fatty acid such as hexanoic acid, heptanoic acid, octanoic acid, nonanoic acid, decanoic acid, undecanoic acid, dodecanoic acid, tridecanoic acid, or tetradecanoic acid; a branched saturated fatty acid such as isohexanoic acid, isoheptanoic acid, 2-ethylhexanoic acid, isooctane acid, isononanoic acid, 2-propyl heptanoic acid, isodecanoic acid, isoundecanoic acid, 2-butyl octanoic acid, isododecanoic acid, and isotridecanoic acid; and an unsaturated fatty acid such as 10-undecenoic acid.

Examples of a method for manufacturing a silver filler having a surface coated with an organic substance include, but are not particularly limited to, a method for manufacturing a silver filler in the presence of an organic solvent by a reductive method. Specifically, the silver filler can be obtained by mixing a carboxylic acid silver salt with a primary amine, and depositing a silver filler using a reducing agent in the presence of an organic solvent, as described in Japanese Patent Laid-open Nos. 2006-183072 and 2011-153362 or the like, for example. In addition, the silver filler can be obtained by a method described in Japanese Patent Laid-open No. 2014-196527 comprising a step of dispersing silver oxalate by using a carrier medium such as water or alcohol, and a dispersion medium such as glycols, followed by applying heat and/or pressure. The entire disclosure of the above applications is incorporated herein by reference.

It is also preferable to disperse the obtained silver filler in a solvent used for manufacturing the filler, and add the dispersion directly to the bonding material of the present invention.

In addition, the surface of the silver filler may be coated with organic substance layers of two or more. Such a filler can be obtained, for example, by dispersing the above manufactured silver filler having a coating of an organic substance into other organic solvents. A solvent to be added to the bonding material of the present invention can be preferably used as such "other solvents".

When the surface of the silver filler is coated with the organic substance, the aggregation of the silver filler in the bonding material can be more prevented or reduced. In addition, the organic substance on the surface of the filler may be eluted, volatilized, or thermally decomposed when heated to expose a silver surface, and as a result, the sinterability of the filler can be more increased.

In one embodiment, the silver filler may be a silver oxide particle or a particle having a silver oxide layer at least on its surface. When such a silver filler is used, the silver surface is exposed by reduction of silver oxide when sintering, and thereby the sinterability can be more increased.

The silver fillers may be used singly or in combination of two or more. Combination of fillers in different shapes or different sizes may reduce porosity of the sintered product. Examples of the combination include, but not limited to, a mixture of a flake-shaped filler, and an approximately spherical-shaped filler having a central particle diameter smaller than that of the flake-shaped filler. The content the approximately spherical-shaped filler may be in the range of 1 to 50 wt % by mass, and more preferably 5 to 30 wt % by mass of the silver filler.

In one embodiment, the bonding material according to the present invention can also comprise a filler of other metals in place of a portion of the silver filler. Examples of the metal other than silver include copper, gold, tin, zinc, titanium, and alloys and oxides of these metals, and among them, copper and an alloy containing copper are preferable.

Preferable examples of the particle diameter, shape, and surface coating of such metal fillers include the same as those exemplified in the above silver filler. The content of the metal filler other than silver filler is preferably 0 to 30% by mass, more preferable 1 to 20% by mass of the silver filler.

Resin Particles

The resin particles form a low-modulus portion, namely, a portion which is more flexible than the matrix of silver component in the bonding layer, and thereby increase the stress relaxation ability of the bonding layer.

Therefore, the elastic modulus (E) of the resin particles is lower than that of the silver matrix, and is preferably 10 GPa or less. The elastic modulus (E) of the resin particles is more preferably 0.01 MPa or more and 1 GPa or less, still more preferably 0.1 MPa or more and 500 MPa or less, and particularly preferably 0.5 MPa or more and 100 MPa or less, and in one embodiment, 1 MPa or more and 50 MPa or less may be particularly preferable. As the elastic modulus (E) of the resin is lower, an effect of absorbing a stress generated during the manufacturing process or cooling-heating cycle at operation of a semiconductor can be more increased. On the other hand, when the elastic modulus (E) is excessively low, bonding strength and workability may be decreased.

Herein, the elastic modulus (E) refers to the Young's modulus (compressive elastic modulus) at 25° C. which can be determined with reference to JIS K 6254 (or 1507742: 2008) as follows:

test piece: 25 mm in diameter, 12.5 mm in thickness
compression speed: 10±1 mm/min
measurement temperature: 25° C.

The test piece is compressed four times at a compression strain of 25%, and the relation between compressive force and distortion is recorded. From the obtained compression/distortion curve of the forth compression, Elastic modulus (E) is calculated with a following formula:

Elastic modulus $(E)$ (MPa)=$F/A \cdot \varepsilon$ wherein "F" represents compressive force (N), "A" represent the original cross-sectional area (mm$^2$) of the test piece, and "s" represents deformation amount of the test piece.

Herein, both a rubber-like (elastomeric) resin and a plastic-like resin may be used as the resin particles.

In one embodiment, the rubber-like particles are more preferable from the viewpoint of stress relaxation. The rubber-like particles have a rubber hardness (durometer type A hardness) of preferably 10 degrees or more and 100 degrees or less, and more preferably 20 degrees or more and 90 degrees or less. The "durometer type A hardness" can be determined with reference to JIS K 6253.

The resin particles for the present invention preferably have high heat resistance. Specifically, the heat decomposition temperature of the resin is preferably 200° C. or more, more preferably 250° C. or more, and still more preferably 300° C. or more, and in one embodiment, 350° C. or more may be particularly preferable.

When the heat decomposition temperature of the resin is within the above range, the deterioration of the mechanical characteristics of the bonding layer at a high temperature operation can be more reduced.

Herein, the "heat decomposition temperature" refers to a temperature at which a weight of the resin is decreased by 1% in temperature rising at a rate of 10° C./minute from 25° C. in an air current using a thermogravimetric measuring apparatus (1% weight decrease temperature).

The shape of the resin particle is not particularly limited, and examples of which include a spherical shape, an approximately spherical shape, a spindle shape, and an unshaped shape. From the viewpoint of dispersibility, the spherical shape, the approximately spherical shape, or the spindle shape is preferable.

The central particle diameter of the resin particles is preferably 0.05 μm or more and 30 μm or less. The central particle diameter is preferably 0.1 μm or more and 20 μm or less, and more preferably 0.5 μm or more and 10 μm or less, and may be particularly preferably 5 μm or less in one embodiment. In one embodiment, the central particle diameter of the resin particles is preferably ⅓ or less of the thickness of the bonding layer.

Herein, the "central particle diameter" of the resin particles represents a 50% particle diameter (D50) in a volume-basis particle size distribution curve obtained by measurement with a laser diffraction particle size analyzer.

The content of the resin particles is preferably 0.1 part by mass or more, more preferably 0.5 part by mass or more, still more preferably 1 part by mass or more, and particularly preferably 2 parts by mass or more based on 100 parts by mass of the above-mentioned silver filler. The content of the resin particles is preferably 9 parts by mass or less, more preferably 8 parts by mass or less, and still more preferably 7 parts by mass or less based on 100 parts by mass of the silver filler. In one embodiment, the content of the resin particles may be yet still more preferably 6 parts by mass or less. When the content of the resin particles is 0.1 part by mass or more, excellent stress relaxation ability is obtained. When the content of the resin particles is 9 parts by mass or less, the proportion of the silver component in the bonding layer is increased, which can improve the thermal conductivity.

In one embodiment, the thermal conductivity may be impaired when a liquid thermosetting resin component is excessively contained in place of, or in addition to the resin particles. In such an embodiment, it is preferred that the bonding material comprises substantially no liquid thermosetting resin component. Specifically, when the liquid thermosetting resin component is contained, the content is preferably 3 parts by mass or less, more preferably 2 parts by mass or less, and still more preferably 1 part by mass or less based on 100 parts by mass of the silver filler.

The resin components of the resin particles used for the present invention are not particularly limited as long as the resin components have the above-mentioned elastic modulus (E) and heat resistance, and known resins can be used. Examples thereof may include a silicone-based resin, a fluorine-based resin, a sulfone-based resin, a phenol-based resin, an epoxy-based resin, an acrylic-based resin, an imide-based resin, an amide imide-based resin, a phenylene oxide resin, a maleimide-based resin, and a cyanate ester-based resin.

Hereinafter, an example of the resin components for the resin particles will be described, but the resin particles according to the present invention are not limited thereto.

Examples of the silicone-based resin include a homopolymer or a copolymer comprising, as a main backbone, a siloxane bond represented by the following formula:

In the formula (1), $R^1_s$ are each independently alkyl group, aryl group, alkenyl group, aralkyl group, haloalkyl group, cycloalkyl group, or univalent group selected from the group consisting of organic groups in which at least one hydrogen atom of the above described groups is substituted by epoxy group, amino group, mercapto group, or (meth) acryloxy group. The number of carbon atoms of $R^1$ is preferably 1 to 20, more preferably 1 to 10. Examples of halogen of the haloalkyl group represented by $R^1$ include chlorine, fluoride, boron, and iodine. Herein, n is not particularly limited, but preferably 1,000-100,000, and more preferably 2,000 to 50,000, and still more preferably 5,000 to 10,000. The polymer structure may be either linear or branched chain.

In one embodiment, $R^1$ in the formula (1) is preferably at least one selected from alkyl group, aryl group, alkenyl group, aralkyl group, and fluoroalkyl group, and more preferably comprises at least one selected from alkyl group (such as methyl and ethyl) and aryl group (such as phenyl).

In one embodiment, 80 mol % or more of $R^1$ is more preferably methyl group.

The silicone-based resin particles according to the present invention are a cured product formed by using the above homopolymer or copolymer as a base component. From the viewpoint of stress relaxation, the cured product is preferably a rubber-like cured product. Preferable examples of silicone rubber may include dimethyl silicone rubber, fluoro silicone rubber, methylphenyl silicone rubber, and methyl-vinyl silicone rubber.

Examples of the fluorine-based resin include homopolymers or copolymers such as tetrafluoro ethylene, tetrafluoro ethylene/propylene, tetrafluoro ethylene/alkoxy ethylene, tetrafluoro ethylene/fluoro vinyl ether, tetrafluoro ethylene/propylene/vinylidene fluoride, ethylene/hexafluoro propylene/tetrafluoro ethylene, vinylidene fluoride, ethylene/hexafluoro propylene, ethylene/hexafluoro propylene/vinylidene fluoride, and fluoro phosphazene. It is also preferable that 90 mol % or more of the total units of the above described polymers are perfluoro-substituted.

Among them, from the viewpoint of heat resistance, tetrafluoro ethylene homopolymer (PTFE) or a copolymer containing a tetrafluoro ethylene unit ($-CF_2-CF_2-$) is preferable. The tetrafluoro ethylene homopolymer, and a copolymer in which 80 mol % or more, preferably 90 mol % or more of the total units is tetrafluoro ethylene unit are more preferable.

The fluorine-based resin particles according to the present invention are a cured product formed by using the above homopolymer or copolymer as a base component. From the viewpoint of stress relaxation, the cured product is preferably a rubber-like cured product.

Preferable examples of fluorine-based rubber (fluororubber) include tetrafluoro ethylene (PTFE), tetrafluoro ethylene/perfluoro alkoxy ethylene (PFA), tetrafluoro ethylene/hexafluoro propene (FEP), and ethylene/tetrafluoro ethylene (ETFE).

Examples of the epoxy-based resin include an aliphatic epoxy resin, an alicyclic epoxy resin, a bisphenol A type epoxy resin, a bisphenol F type epoxy resin, an epoxy novolac type resin, a biphenyl type epoxy resin, a naphthalene type epoxy resin, and mixtures thereof. The epoxy-based resin particles according to the present invention are preferably a cross-linking cured product formed from the above resin components.

Known curing agents and vulcanizing agents or the like can be used for curing or vulcanizing the above resin components.

From the viewpoint of stress relaxation, rubber-like particles formed from the silicone-based resin, fluorine-based resin, and epoxy-based resin components are preferable. From the viewpoint of heat resistance, silicone rubber and fluororubber are more preferable.

The resin particles may be in a form in which the above resin components are supported by an inorganic carrier or the like. An inorganic filler, a metal filler, a heat-resistant stabilizing agent, and an antioxidant or the like may be contained within the range of not inhibiting the effect of the present invention.

The resin particles also preferably have a coating layer on the surfaces.

The resin components exemplified above can be used for the coating layer, for example. In one embodiment, heat resistance and shape stability can be improved by increasing the cross-linking density of the resin component of the coating layer as compared with the resin particles inside.

From the viewpoint of heat resistance, the coating layer is preferably a silicone-based resin. Preferable examples include a polyorgano silsesquioxane cured product having a cross-linking structure represented by the following formula:

wherein the definition of $R^1$ is the same as that of the formula (1), and 50 mol % or more of $R^1$ is more preferably methyl group.

When the resin particles have a coating layer, the coating percentage of the coating layer is preferably 1% or more and 100% or less, preferably 5% or more, and preferably 10% or more based on the surface area of the resin particles. The mass percentage of the coating ratio is preferably 0.5% by mass or more and 500% by mass or less, and more preferably 1% by mass or more and 100% by mass or less based on the resin particles.

Resin particles may be used singly or in combinations of two or more.

Commercially available products may also be used for the resin particles in the present invention, examples of which include silicone-based resin particles such as KMP-600, KMP-601, KMP-602, KMP-605, and X-52-7030 manufactured by Shin-Etsu Chemical Co., Ltd.

Additive Agent

The bonding material of the present invention can further comprise an additive agent. Examples of the additive agent may include a sintering promoter capable of promoting the sintering of the silver filler during heating. The sintering promoter is not particularly limited, and can be suitably selected in consideration of the combination with the silver filler, or the like.

Examples of the sintering promoter include a component capable of promoting the elution and/or the thermal decomposition of the organic substance coating the surface of the silver filler.

Examples of such a component include an organic base compound and a compound that functions as an oxidant.

The organic base compound is preferably a nitrogen-containing basic compound. Examples of the nitrogen-containing basic compound include non-cyclic amine compounds, nitrogen-containing hetero ring compounds, phosphazene compounds and the like, and the nitrogen-containing hetero ring compounds are preferable.

Examples of the non-cyclic amine compound include alkylamines, amino-alcohols and alkylene diamines. The non-cyclic amine compound preferably has 1 to 15 carbon atoms, more preferably 1 to 10 carbon atoms.

The alkylamine includes mono, di or tri-alkyl amine, and is preferably trialkylamine. Examples of the trialkylamine include trimethylamine, triethylamine, diisopropylethylamine, tributylamine and the like. Examples of the amino-alcohol include mono, di, or tri-alcohol amine such as monoethanolamine, diethanolamine, triethanolamine, 2-amino-2-methyl 1-propanol, diisopropanolamine and triisopropanol amine. Examples of the alkylene diamine include ethylenediamine, hexamethylene diamine and the like.

Examples of the nitrogen-containing hetero ring compound include non-aromatic cyclic amine compounds, nitrogen-containing aromatic hetero ring compounds, nitrogen-containing polycyclic hetero ring compounds and the like.

Examples of the non-aromatic cyclic amine compound include cyclic secondary amine compounds such as ethylene imine (or aziridine), pyrrolidine, piperidine and morpholine; and cyclic tertiary amine compounds such as 1,4-diazabicyclo[2.2.2]octane (DABCO), N-methyl pyrrolidine and N-methyl morpholine.

Examples of the nitrogen-containing aromatic hetero ring compound include pyridine based compounds such as pyridine, picoline, 2,6-lutidine, colidine and dimethylaminopyridine (DMAP); imidazole based compounds; triazole based compounds such as 1,2,3-triazole, 1,2,4-triazole and benzotriazole; bipyridine compounds such as 2,2'-bipyridine and 4, 4'-bipyridine; pyrimidine bases; purine bases; and triazine based compounds. The nitrogen-containing aromatic hetero ring compound preferably has a five-membered ring or six-membered ring as a nitrogen-containing moiety. Among these, imidazole-based compounds are preferable.

Examples of the imidazole based compound may include, but not limited to, imidazole and benzimidazole. The imidazole based compounds may have at least one substituent, examples of which include alkyl group having 1 to 4 carbon atoms, hydroxyl group, amino group, phenyl group and the like. The substituent is preferably methyl group or ethyl group, and more preferably methyl group.

Examples of the nitrogen-containing polycyclic hetero ring compound may include 1,8-Diazabicyclo[5.4.0]-7-undecene (DBU), 1,5-Diazabicyclo[4.3.0]-5-nonene (DBN), 7-Methyl-1,5,7-triazabicyclo[4.4.0]dec-5-ene (MTBD), 1,5, 7-Triazabicyclo[4.4.0]dec-5-ene (TBD), and the like.

Examples of the phosphazene compound include, but not limited to, phospazene bases such as BEMP (2-tert-butyl-imino-2-diethylamino-1,3-dimethylperhydro-1,3,2-diaza-phosphorine), tBu-P1 (tert-butylimino-tris(dimethylamino) phosphorane), tBu-P1-t (tert-butylimino-tri(pyrrolidino) phosphorane), Et-P2 (1-ethyl-2,2,4,4,4-pentakis (dimethyl-amino)-2$\lambda^5$,4$\lambda^5$-catenadi (phosphazene)), tBu-P4 (1-tert-butyl-4,4,4-tris(dimethylamino)-2,2-bis[tris(dimethylamino)-phosphoranylidenamino]-2$\lambda^5$,4$\lambda^5$-catenadi(phosphazene)) and the like.

In one embodiment, the nitrogen-containing hetero ring compound is preferably a compound having two or more nitrogen atoms in a molecule, examples of which may include a compound having an amidine moiety and/or a guanidine moiety. Herein, the amidine moiety is a structure in which two nitrogen atoms are bonded to one carbon atom with one single bond and one double bond, respectively. The guanidine moiety is a structure in which three nitrogen atoms are bonded to one carbon atoms with two single bonds and one double bond, respectively. Examples of such a compound include imidazole based compounds, DBU, DBN, MTBD, TBD and the like.

The pKa of the conjugate acid of the organic base compound of the present invention is preferably 7.0 or more, and more preferably 8.0 or more. In one embodiment, a compound having a higher basicity is more preferable, and the pKa of its conjugate acid is preferably 9.0 or more, more preferably 10.0 or more, and still more preferably 11.0 or more. Herein, the pKa of the conjugate acid is a value measured at 25° C. in DMSO.

Preferably, the organic base compound is not, or scarcely present in the sintered product. From this aspect, the boiling point of the organic base compound is preferably not excessively higher than the sintering temperature of the bonding material of the present invention, more preferably lower than the sintering temperature, and still more preferably lower by more than 100° C. than the sintering temperature.

In one embodiment, in view of its effect on sintering of silver filler, imidazole based compounds, DBU and DBN are preferable.

The organic base compound may be used singly, or in combination of two or more.

Examples of an oxidant may include an organic peroxide, an inorganic peroxide, and an inorganic acid and the like.

The organic peroxide is a compound having a peroxide anion $O_2^{2-}$ or peroxide group —O—O—, and at least one organic group directly bonded thereto. Examples thereof include diisobutyryl peroxide, cumol peroxyneodecanoate, 1,1,3,3-tetrametylbutyl peroxyneodecanoate, di-n-propyl peroxydicarbonate, tert-amyl peroxyneodecanoate, di-(2-ethyl hexyl)-peroxydicarbonate, tert-butyl peroxyneodecanoate, di-n-butyl peroxydicarbonate, 1,1,3,3-tetramethyl-butyl peroxypivalate, tert-butyl peroxyneoheptanoate, tert-amyl peroxypivalate, tert-butyl peroxypivalate, di-(3,5,5-trimethylhexanoyl)peroxide, tert-butyl-peroxy-2-ethylhexanoate, tert-butyl peroxyisobutyrate, 1,1-di-(tert-butylperoxy)-3,3,5-trimethylcyclohexane, 1,1-di-(tert-butylperoxy)-cyclohexane, tert-butyl-peroxy-3,5,5-trimethylhexanoate, 2,2-di-(tert-butylperoxy)-butane, tert-butyl peroxyisopropylcarbonate, tert-butyl peroxyacetate, 2,5-dimethyl-2,5-di(2-ethylhexanoylperoxy)-hexane, 1,1,3, 3-tetramethylbutyl peroxy-2-ethylhexanoate, tert-amyl-peroxy-2-ethylhexanoate, tert-butyl peroxydiethylacetate, tert-amyl-peroxy-2-ethylhexylcarbonate, tert-butyl peroxy-2-ethylhexylcarbonate, tert-butyl peroxybenzoate, di-tert-amyl peroxide, 2,5-dimethyl-2,5-di-(tert-butylperoxy)-hexane, tert-butyl cumyl-peroxide, 2,5-dimethyl-2,5-di(tert-butylperoxy)hexyne-3, di-tert-butyl peroxide, 3,6,9-triethyl-3,6,9-trimethyl-1,4,7-triperoxonane, di-isopropylbenzene-mono-hydroperoxide, p-menthane hydroperoxide, cumol hydroperoxide, dicumyl peroxide, and 1,1,3,3-tetramethyl-butyl hydroperoxide.

The inorganic peroxide is a compound having a peroxide anion $O_2^{2-}$ or peroxide group —O—O—, and inorganic group directly bonded thereto. Examples thereof include hydrogen peroxide, ammonium peroxide, monomethylammonium peroxide, dimethylammonium peroxide, trimethylammonium peroxide, monoethylammonium peroxide, diethylammonium peroxide, triethylammonium peroxide, monopropylammonium peroxide, dipropylammonium peroxide, tripropylammonium peroxide, monoisopropylammonium peroxide, diisopropylammonium peroxide, triisopropylammonium peroxide, monobutylammonium peroxide, dibutylammonium peroxide, tributylammonium peroxide, lithium peroxide, sodium peroxide, potassium peroxide, magnesium peroxide, calcium peroxide, barium peroxide, ammonium perborate, lithium perborate, potassium perborate, or sodium perborate.

In the present invention, the organic peroxide and the inorganic peroxide preferably have a decomposition temperature (1 hour half life temperature) of 200° C. or less.

Examples of the inorganic acid include phosphate compounds such as orthophosphoric acid, pyrophoric acid, metaphosphoric acid, and polyphosphoric acid.

A component promoting the reduction of the silver oxide which may be present on the surface of the silver filler is also preferably used as the sintering promoter.

Examples of the component promoting the reduction of the silver oxide include an alcohol compound and a carboxylic compound. Examples of the alcohol compound may include a polyhydric alcohol such as citric acid, ascorbic acid, and glucose. Examples of the carboxylic compound may include primary carboxylic acid such as alkyl carboxylic acid, secondary carboxylic acid, and tertiary carboxylic acid; dicarboxylic acid; and a carboxyl compound having a cyclic structure. An organic acid salt, an organic acid ester, and a carbonyl complex or the like which emits or generates carbon monoxide during sintering can also be used as the component promoting the reduction of silver oxide.

The additive agents may be used singly or in combinations of two or more.

When the additive agent is used, the content of the additive agent is preferably 0.01 to 3 parts by mass, more preferably 0.05 to 1.5 parts by mas, and still more preferably 0.1 to 1.0 parts by mass based on 100 parts by mass of the silver filler.

Solvent

The bonding material of the present invention can further comprise a solvent that vaporizes or vanishes at the sintering temperature or less of the bonding material.

The solvent can adjust the flowability of the bonding material to improve the workability. The solvent may also have an effect of improving the sinterability of the silver filler by volatilizing during sintering and/or removing an organic layer coating the silver filler. A compound having an effect of promoting the reduction of the silver oxide layer is also preferably used as the solvent.

The boiling point of the solvent used in the present invention is preferably 60° C. or more and 300° C. or less. When the boiling point is in the above range, volatilization of the solvent during the manufacturing process or remaining of the solvent after the sintering can be suppressed.

Examples of the solvent include alcohols such as aliphatic alcohols, alicyclic alcohols, aromatic alcohols, and polyhydric alcohol; glycol ethers; glycol esters; glycol ether esters; aliphatic and/or aromatic hydrocarbons; esters; ethers; amides; and cyclic ketones. Specific examples of the solvent include, but not particularly limited to, methyl carbitol, ethyl carbitol, propyl carbitol, butyl carbitol(BC), dipropylene glycol monomethyl ether(DPGME), triethylene glycol dimethyl ether, methyl cellosolve, ethyl cellosolve, or butyl cellosolve, ethyl carbitol acetate, butyl carbitol acetate (BCA), methyl cellosolve acetate, or ethyl cellosolve acetate, ethylene glycol, dipropylene glycol(DPG), polyethylene glycol, cyclooctanone, cycloheptanone, cyclohexanone, benzyl alcohol, glycerin, butyl ethoxyethyl acetate, propylene carbonate, tetrahydrofuran, diethyl eter, γ-butyrolactone, isophorone, glycidyl phenyl ether, terpineol, dimethylformamide, dimethylacetamide, N-methylpyrrolidone or the like.

The solvents may be used singly or in combinations of two or more.

The amount of the solvent to be added is not particularly limited, and preferably in the range of 0.5 part by mass or more and 20 parts by mass or less, and more preferably 1 part by mass or more and 10 parts by mass based on 100 parts by mass of the silver filler. In one embodiment, the amount is preferably 8 parts by mass or less. When the amount of the solvent is in the above range, a shrinkage ratio in a drying or sintering step after applying can be more reduced, while maintaining an improved workability during manufacturing.

The bonding material according to the present invention has a viscosity of, preferably in the range of 5000 to 150,000 mPa·s, and more preferably in the range of 8,000 to 100,000 mPa·s. The bonding material preferably has a thixotropic index in the range of 1.0 to 5.0. When the viscosity and thixotropic index are within the above range, the workability of the bonding material can be more improved. Herein, the viscosity represents a value measured under conditions of no 7 spindle/10 rpm/25° C. using a brookfield viscosity meter (RV DV-II). The thixotropic index is a value calculated as a ratio of a viscosity at 0.5 rpm/a viscosity at 5 rpm measured likewise.

Furthermore, inorganic fine particles, an antioxidant, a stabilizing agent, a dispersing agent, and a thixotropic property imparting material or the like can be added to the bonding material if needed within the range of not impairing the effect of the present invention.

The bonding material according to the present invention can be manufactured by introducing the silver filler and the resin particles, and optionally the additive agent, the solvent and the like into a mixer such as a bead mill, a grinder, a pot mill, a three-roll mill, a rotary mixer, or a twin-screw mixer, and mixing these.

The bonding layer is formed by applying the bonding material according to the present invention to a desired portion of a member to be bonded, and heating them. The bonding layer has a structure where the resin components having excellent stress relaxation ability are dispersed in the matrix of sintered silver.

The proportion of the low-modulus portions containing the resin components is preferably 1 to 50% by volume, and more preferably 5 to 40% by volume of the bonding layer.

The bonding layer formed from the bonding material according to the present invention preferably has a low porosity (a proportion of a volume of air spaces formed in the silver sintered product). When porosity is lower, the stress relaxation ability of the bonding layer may be decreased while superior bonding strength and thermal conductivity are obtained. According to the present invention however, the silver sintered product has a structure where low-modulus portions of resin component are dispersed in a silver sintered matrix having a low porosity, thereby both of excellent bonding strength and heat release characteristics, and an improved stress relaxation ability can be achieved.

Therefore, the porosity of the bonding layer after sintering is preferably 0% or more and 12% or less, more preferably 10% or less, and still more preferably 8% or less.

Herein, the porosity is an average value over the bonded area (the area sandwiched between the two members to be bonded), and can be measured as follows and explained in details in Example.

1. Polish the bonded article with a polisher to expose a cross-sectional surface of the bonded layer.
2. Take more than ten SEM Images of the surface from one end of the bonded area to another end.
3. Import the images into a microscope, extract air spaces in the image by luminance extraction, and calculate the proportion of an area of the air spaces. Porosity of the bonded area is calculated as an average of the porosities of all the images taken.

According to the present invention, a bonding layer having high thermal conductivity can be obtained. The thermal conductivity of the bonding layer (25° C.) is preferably 80 W/mK or more, and more preferably 160 W/mK or more. In one embodiment, the thermal conductivity of 200 W/mK or more is still more preferable. Herein, the thermal conductivity can be determined by a method using a laser-flash calorimeter with reference to JIS R1611-2010, the details of which are explained in Example.

The thickness of the bonding layer can be suitably set to exhibit required bonding strength in accordance with applications, and for example, the thickness can be set to 50 to 100 μm.

The bonding material according to the present invention can be suitably used for various applications, and is particularly suitable for the bonding of elements of a power semiconductor, and/or parts having different thermal expansion coefficients.

A method for manufacturing a bonded article using a bonding material according to the present invention includes the steps of:
 providing two members to be bonded;
 disposing the two members and a bonding material so that surfaces to be bonded of the two members face to each other with the bonding material according to the present invention disposed therebetween; and
 heating the two members with the bonding material disposed therebetween to a predetermined temperature.

As one aspect of the bonded article using the bonding material according to the present invention, a semiconductor device and a manufacturing method of the same will be described.

FIG. 1 is a partial cross-sectional view of a semiconductor device according to the present embodiment. In one embodiment, the semiconductor device includes a semiconductor chip (1) and a substrate (4) wherein the semiconductor chip (1) and a metal surface of the substrate (3) are bonded to each other by a bonding layer (2) obtained by sintering the bonding material according to the present invention. In another embodiment, the semiconductor device further includes a cooling plate (5) wherein the semiconductor chip (1) and the metal surface of the substrate (3) and/or the metal surface of the substrate (3) and the cooling plate (5) are bonded to each other by a bonding layer (2 and/or 2') obtained by sintering the bonding material according to the present invention.

Member to be Bonded

The semiconductor chip is not particularly limited. Examples thereof may include, but are not limited to, a Si chip and a SiC chip. The back side (the surface to be bonded) of the semiconductor chip is preferably metal-plated with silver, copper, nickel, and gold or the like. Examples of the shape of the semiconductor chip include, but are not particularly limited to, a square and a rectangle which have a height and a width of about 2 mm to about 15 mm.

Examples of the substrate include, but are not particularly limited to, a metal substrate, a ceramic substrate, and a substrate having a structure in which a metal layer and a ceramic layer are layered in a sandwich structure. The surface of the substrate (the surface to be bonded) is preferably a metal. For example, a metal-plated substrate such as a silver-plated substrate, a gold-plated substrate, a nickel-plated substrate, or a tin-plated substrate; and a metal substrate such as a copper substrate or an aluminum substrate can be suitably used. Specific examples may include, but not limited to, DBU substrate, DBA substrate and AMB substrate.

Method for Manufacturing Semiconductor Device

A method for manufacturing a semiconductor device according to the present embodiment includes the steps of:
(1) applying the bonding material according to the present invention on a substrate,
(2) placing a semiconductor chip on the substrate, and
(3) heating the substrate on which the semiconductor chip is placed.

In the above step (1), the method for applying the bonding material on the substrate is not particularly limited, and a dispense method and a screen printing method or the like can be used.

In the above step (2), a known method may be used as the method for placing (mounting) the semiconductor chip on the substrate. The above step (2) may also include the step of positioning the semiconductor chip, and the step of adjusting the thickness of the bonding material to be applied, or the like.

In the above step (3), the method of heating can be appropriately selected according to the bonding material or the member to be bonded.

An example of sintering profile, but not limited to, includes:
Drying step: 90° C. or more, 15 minutes or more
Sintering temperature: 250° C. or more, for example, 300° C.
Pressure: 10 MPa or more
Time: 3 minutes to 5 minutes The semiconductor device manufactured by the manufacturing method according to the present embodiment has a long-term reliability because its bonding layer is excellent in bonding strength and heat-release characteristics as well as in stress relaxation ability.

The bonding material according to the present invention can be used for various applications such as an electronic part, an electronic device, an electric part, and an electric device. For example, the bonding material can be suitably used to bond a chip component and a circuit substrate of for example a capacitor or a resistor; a semiconductor chip and a lead frame or a circuit substrate of for example a diode, a memory, an IC, or a CPU; and a high heat generating CPU chip and a cooling plate.

EXAMPLES

Hereinafter, the present invention will be described with Examples for the purpose of describing the present invention in more detail. These Examples are used for describing the present invention, and do not limit the present invention at all.

Materials used in the present Examples will be shown below. If not otherwise specified, commercially available high-purity products were used as reagents.
<Silver Filler>
Silver filler 1:
a mixture of a flake-shaped filler (aspect ratio=20~200, Ra≤10 nm) and
spherical-shaped filler, D50=0.45 μm
Silver filler 2:
spherical-shaped filler, D50=2.1 μm,
specific surface area=0.9 mm$^2$, TAP density=5.1 g/cm$^3$
<Resin Particles>
Resin 1: spherical-shaped silicone powder (X-52-7030, manufactured by Shin-Etsu Silicones), D50=5 μm
<Additive>
Perbutyl D (di-tert-butylperoxide)
DBU (1,8-diazabicyclo[5.4.0]undec-7-ene)
<Solvent>
BCA (butyl carbitol acetate)
BC (butyl carbitol)
DPG (dipropylene glycol)

Example 1

Preparation of Bonding Material

A silver filler, resin particles, an additive agent, and a solvent were mixed at a proportion shown in Table 1 to prepare a bonding material.

Evaluation of Warpage

The obtained bonding material was printed at a thickness of 100 μm on a substrate (a silver-plated copper lead frame, 25×25 mm, a thickness of 0.3 mm). A semiconductor chip (backside silver-plated Si die, 10×10 mm) was mounted on the substrate. The substrate with the chip was dried at 90° C. for 30 minutes, and heated under conditions of 300° C./5 minutes/10 MPa in an oven to obtain a test piece for evaluation. The thickness of the bonded layer after sintering was about 40 to 60 μm.

Warpage generated by sintering process was measured by using a three-dimensional length measuring machine (KS-1100 manufactured by Keyence Corporation).

Evaluation of Thermal Conductivity

The obtained bonding material was printed at a thickness of 100 μm between two substrates (silver-plated copper having a thickness of 500 μm, 5 mmφ). The two substrates with the bonding material were dried at 90° C. for 30 minutes, and heated under conditions of 300° C./5 minutes/ 10 MPa in an oven to obtain a test piece for evaluation. The thickness of the bonding layer after sintering was about 40 to 60 μm, and of the obtained test piece (i.e., the thicknesses of the two substrates and the bonding layer) was about 1.0 to 1.1 mm.

Measurement of Thermal Conductivity

The obtained test piece was place in Kyoto Denshi Kogyo LFA-502, and the thermal conductivity of the thickness direction was determined by measuring thermal diffusivity (α(m$^2$/s)), specific heat capacity(c (J/gK)), and material density (ρ(kg/cm$^3$)) at room temperature (23±1° C.), and the thermal conductivity (λ(W/mK)) was calculated by the relation: λ=αcρ.

As the reference, thermal conductivity of a silver-plated copper plate having a thickness of 1 mm was measured in the same manner as above, which was 380 W/mK.

Cooling-Heating Cycle Test

The obtained bonding material was printed at a thickness of 100 μm on a substrate (silver-plated copper DBC, 25×25 mm, a thickness of 1 mm). The semiconductor chip (backside silver-plated Si die, 5×5 mm) was mounted on the substrate. The substrate with the chip was dried at 90° C. for 30 minutes, and heated under conditions of 300° C./5 minutes/10 MPa in an oven to obtain a test piece for evaluation.

The state of the bonded part was evaluated by using an SAT (scanning acoustic microscope). Also, a porosity of the bonding layer was determined as follows.

Porosity Determination

1. Polishing of the test piece:
Device: BUEHLER Beta GRINDER-POLISHER 60-1990
Polishing papers: Struers SiC Paper #120, #220, #500, #800, #1200, #2000
Buff: Struers DP-Nap Size: 200 mm dia
Diamond spray: Struers DP-Spray P 1 μm, ¼ μm The test piece was polished with polishing papers #120, #220, #500, #800, #1200, #2000, Buff, Diamond spray 1 μm, ¼ μm in turn to expose a cross sectional surface of the bonding layer.

2. SEM Imaging: SEM Images of the cross sectional surface of the bonding layer were taken by using Scanning Electron Microscope (HITACHI S-3000, magnification=2000 fold, 1280×960 dpi, 15 images from right edge to left edge of the bonded area.).

3. Porosity calculation: The obtained images were imported into a microscope (Keyence Digital Microscope VHX-500), air spaces were extracted by luminance extraction, and porosity was determined as a proportion of the area of air spaces in the image. The average porosity was calculated by averaging the porosities of 15 images.

The test pieces produced in the same way as above were subjected to a cooling-heating cycle in which the test piece was cooled to −55° C. and held for 30 minutes, heated to +200° C. and held for 30 minutes as 1 cycle. After 250 cycles, 500 cycles, and 750 cycles, the state of the bonded part and a porosity of the bonding layer were evaluated as described above.

Figure 3:
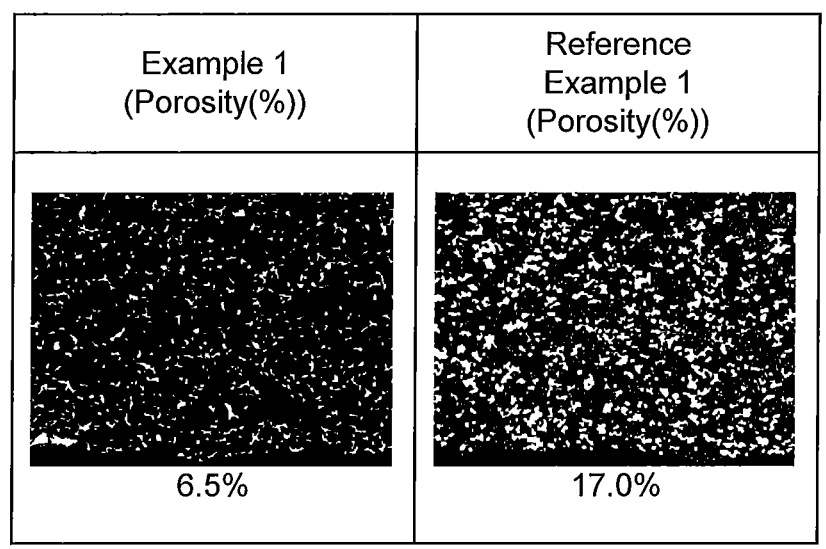
FIG. 3 are SEM images of the cross-sectional surface of the bonding layer in Examples.
Figure 4:
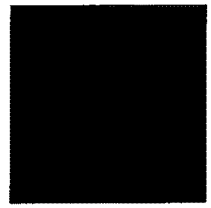
FIG. 4 are SAT images of the bonded part before and after the cooling-heating cycle in Examples.
Figure 4:
Figure 4:
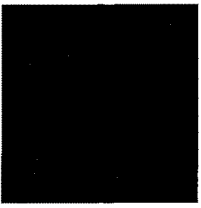
Figure 4:
Figure 4:
Figure 4:
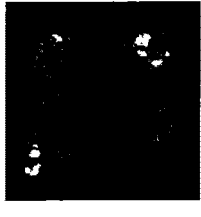
Figure 4:
Figure 4:
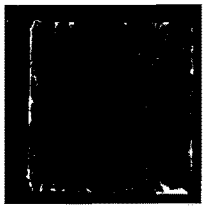
Figure 4:
Figure 4:
Figure 4:
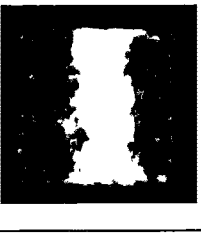
Figure 4:
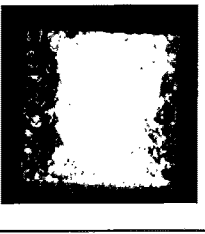

The evaluation results are shown in Table 1, and FIGS. 2 to 4

Comparative Example 1

A silver filler, resin particles, an additive agent, and a solvent were mixed at a proportion shown in Table 1 to prepare a bonding material. The obtained bonding material was evaluated in the same manner as in Example 1. The results are shown in Table 1, and FIGS. 2 and 4.

Comparative Example 2

A silver filler, resin particles, an additive agent, and a solvent were mixed at a proportion shown in Table 1 to prepare a bonding material. The obtained bonding material was evaluated in the same manner as in Example 1. The results are shown in Table 1, and FIGS. 2 and 4.

Reference Example 1

A silver filler, resin particles, an additive and a solvent at a proportion shown in Table 1, and a liquid epoxy resin (bisphenol A type epoxy resin containing imidazole) in an amount of 1.0% by mass of the total mass of the bonding material were mixed to prepare a bonding material. The obtained bonding material was evaluated in the same manner as in Example 1. The results are shown in Table 1, and FIG. 3.

TABLE 1

|  | Example 1 | Comparative Example 1 | Comparative Example 2 | Reference Example 1 |
|---|---|---|---|---|
| Bonding Material |  |  |  |  |
| silver filler | filler 1 (89.9 wt %) | filler 1 (94.9 wt %) | filler 2 (90.24 wt %) | filler 1 (89.9 wt %) |
| resin | resin 1 (5.0 wt %) | — | — | resin 1 (5.0 wt %) |
| additive | DBU (0.2 wt %) | DBU (0.2 wt %) | Perbutyl D (0.2 wt %) | DBU (0.2 wt %) |
| solvent | BC (4.9 wt %) | BC (4.9 wt %) | BCA/DPG 1/1 (9.56 wt %) | BC (4.9 wt %) |
| Thermal Conductivity (W/mK) | 175 | 270 | 200 | 115 |
| Stress Reduction Test (Measurement of warpage (μm)) |  |  |  |  |
| Chip | 139 | 170 | 160 | 149 |
| Substrate | 330 | 470 | 410 | 375 |
| Reliability Test (Measurement of porosity before and after cooling-heating cycle (%)) |  |  |  |  |
| initial | 6.5 | 1.0 | 13.0 | 17.0 |
| 250 cycle | 7.0 | 1.5 | 15.0 | not determined |
| 500 cycle | 11.0 | 3.0 | 23.0 |  |
| 750 cycle | 13.5 | 8.5 | 19.5 |  |

As shown in Table 1, it was found that the warpage of the chip and substrate was largely reduced in Example 1 as compared with Comparative Examples 1 and 2 while maintaining a high thermal conductivity.

As shown in FIG. 2, although a low porosity was achieved in Comparative Example 1, the air-space formed in the bonding layer tends to grow to a larger size along with the cooling-heating cycle. In Comparative Example 2, the porosity was high, and the air-space tends to grow to a larger size along with the cooling-heating cycle. On the other hand in Example 1, air spaces were uniformly dispersed in the bonding layer, and the porosity was maintained at 13.5% or less even after the long-term cooling-heating cycle.

As shown in FIG. 4, the exfoliation of the bonded part was remarkably increased along with the cooling-heating cycle in Comparative Example 2. Also in Comparative Example 1, the exfoliation of the bonded part was observed particularly at the edge of the bonded area along with the cooling-heating cycle. On the other hand in Example 1, no exfoliation of the bonded part was observed even after the long-term cooling-heating cycle.

These results demonstrate that the use of the bonding material of the present invention can provide a bonded article having high thermal conductivity and stress relaxation ability, and excellent long-term reliability.

A bonding material according to the present invention can be applied to an electronic component, an electronic device, an electric component, and an electric device or the like. In particular, the bonding material can be usefully used to bond a chip component and a circuit substrate of a capacitor, a resistor or the like; a semiconductor chip, and a lead frame or a circuit substrate of a diode, a memory, an IC, a CPU or the like; and a high-heat-generating CPU element and a cooling plate.

EXPLANATION OF SYMBOLS

1: semiconductor chip
2, 2': bonding layer
3: metal surface of substrate
4: substrate
5: cooling plate

The invention claimed is:

1. A sinterable bonding material comprising a silver filler and resin particles, wherein the silver filler comprises a flake-shaped filler having an arithmetic average roughness (Ra) of 10 nm or less and an aspect ratio of 20-200; and the resin particles have an elastic modulus (E) of 10 GPa or less, and a heat decomposition temperature of 200° C. or more.

2. The sinterable bonding material according to claim 1, wherein a content of the silver filler is 90% by mass or more and 99.9% by mass or less of the total mass of solid components of the bonding material.

3. The sinterable bonding material according to claim 1, wherein the elastic modulus (E) of the resin particles is 100 MPa or less.

4. The sinterable bonding material according to claim 1, wherein the resin particles comprise silicone rubber particles and/or fluororubber particles.

5. The sinterable bonding material according to claim 1, wherein the silver filler comprises a crystalline flake-shaped filler.

6. The sinterable bonding material according to claim 1, further comprising an additive agent.

7. The sinterable bonding material according to claim 1, further comprising a solvent.

8. A silver sintered product comprising resin particles dispersed therein and silver filler, wherein the resin particles have an elastic modulus (E) of 10 GPa or less, and a heat decomposition temperature of 200° C. or more, and wherein the silver filler comprises a flake-shaped filler having an arithmetic average roughness (Ra) of 10 nm or less and an aspect ratio of 20-200.

9. The silver sintered product according to claim 8, having an average porosity of 10% or less.

10. A bonded article bonded by the silver sintered product according, to claim 8.

11. A method for manufacturing a semiconductor device comprising the steps of:
    providing two members to be bonded;
    disposing the two members and a bonding material so that surfaces to be bonded of the two members face to each other with the bonding material disposed therebetween; and
    heating the two members with the bonding material disposed therebetween to a predetermined temperature,
    wherein the bonding material is a sinterable bonding material comprising a silver filler and resin particles, wherein
    the silver filler comprises a flake-shaped filler having an arithmetic average roughness (Ra) of 10 nm or less and an aspect ratio of 20-200; and
    the resin particles have an elastic modulus (E) of 10 GPa or less, and a heat decomposition temperature of 200° C. or more.

12. A silver sintered product comprising a flake-shaped filler having an arithmetic average roughness (Ra) of 10 nm or less and an aspect ratio of 20-200 and resin particles dispersed therein wherein the resin particles have an elastic modulus (E) of 10 GPa or less, and a heat decomposition temperature of 200° C. or more.

* * * * *

UNITED STATES PATENT AND TRADEMARK OFFICE
CERTIFICATE OF CORRECTION

PATENT NO. : 10,446,518 B2
APPLICATION NO. : 15/631282
DATED : October 15, 2019
INVENTOR(S) : Hajime Inoue and Tadashi Takano Page 1 of 1

It is certified that error appears in the above-identified patent and that said Letters Patent is hereby corrected as shown below:

In the Specification

Column 5, Line 10: Change "(ED)" to --($\delta$D)--.

Column 7, Lines 46-47: Change "1507742:2008" to --ISO7742:2008--.

Column 7, Line 60: Change "s" to --"$\epsilon$"--.

Signed and Sealed this
Eleventh Day of August, 2020

Andrei Iancu
*Director of the United States Patent and Trademark Office*